(12) United States Patent
Sundberg et al.

(10) Patent No.: US 6,986,873 B2
(45) Date of Patent: Jan. 17, 2006

(54) METHOD OF PRODUCING A METAL-CONTAINING SINGLE-PHASE COMPOSITION

(75) Inventors: Mats Sundberg, Västeras (SE); Kjell Lindgren, Hallstahammar (SE); Tamer El-Raghy, Philadelphia, PA (US); Michael Barsoum, Pennsauken, NJ (US)

(73) Assignees: Sandvik AB, Sandviken (SE); Drexel University, Philadelphia, PA (US)

( * ) Notice: Subject to any disclaimer, the term of this patent is extended or adjusted under 35 U.S.C. 154(b) by 119 days.

(21) Appl. No.: 10/481,859

(22) PCT Filed: May 23, 2002

(86) PCT No.: PCT/SE02/00984

§ 371 (c)(1),
(2), (4) Date: Dec. 20, 2003

(87) PCT Pub. No.: WO03/000618

PCT Pub. Date: Jan. 3, 2003

(65) Prior Publication Data

US 2004/0156772 A1 Aug. 12, 2004

(30) Foreign Application Priority Data

Jun. 21, 2001 (SE) ............................... 0102214

(51) Int. Cl.
*C01B 33/00* (2006.01)
*C03C 3/118* (2006.01)
*C03C 3/102* (2006.01)

(52) U.S. Cl. ............................ 423/324; 423/62; 423/71; 423/89; 423/111; 423/115; 501/59; 501/63; 501/93

(58) Field of Classification Search ................. 423/324, 423/62, 69, 71, 89, 111, 115; 501/54–56, 501/59, 63, 68, 71, 87–89, 91, 93, 96.1, 96.3, 501/97.1, 98.4, 98.6; 419/10, 13–15, 47; 264/405, 449

See application file for complete search history.

(56) References Cited

U.S. PATENT DOCUMENTS

| | | | | |
|---|---|---|---|---|
| 4,909,842 A | * | 3/1990 | Dunmead et al. | 75/236 |
| 4,946,643 A | * | 8/1990 | Dunmead et al. | 419/12 |
| 4,961,529 A | * | 10/1990 | Gottselig et al. | 228/124.1 |
| 5,330,701 A | * | 7/1994 | Shaw et al. | 419/10 |
| 5,608,911 A | * | 3/1997 | Shaw et al. | 419/45 |
| 6,171,709 B1 | * | 1/2001 | Koizumi et al. | 428/545 |
| 6,417,105 B1 | * | 7/2002 | Shah et al. | 438/682 |
| 6,461,989 B1 | | 10/2002 | El-Raghy et al. | 501/87 |
| 6,497,922 B2 | * | 12/2002 | Knight et al. | 427/450 |

FOREIGN PATENT DOCUMENTS

| | | |
|---|---|---|
| CN | 1250039 | 4/2000 |
| SE | 516 644 C2 | 2/2002 |

* cited by examiner

*Primary Examiner*—Colleen P Cooke
(74) *Attorney, Agent, or Firm*—Alfred J. Mangels

(57) ABSTRACT

A method of producing a single-phase composition $M_{n+1}A_zX_n$, primarily the production of the single-phase material $Ti_3SiC_2$, where n lies within a range of 0.8–3.2, where z lies within a range of 0.8–1.2, where M is at least one metal taken from the group of metals Ti (titanium), Sc (scandium), V (vanadium), Cr (chromium), Zr (zirconium), Nb (niobium) and Ta (tantalum), where X is at least one of the non-metals C (carbon) and N nitrogen), and where A is at least one of the chemical elements Si (silicon), Al (aluminum) and Sn (tin) or a compound of those elements, such that the final, desired compound will include the components $M_{n+1}A_zX_n$. A powder mixture of the components is formed and is ignited under an inert atmosphere to prevent promotion of dissociation and to cause the components to react.

7 Claims, No Drawings

METHOD OF PRODUCING A METAL-CONTAINING SINGLE-PHASE COMPOSITION

BACKGROUND OF THE INVENTION

1. Field of the Invention

The present invention relates to a method of producing a metal-containing single-phase composition. The invention relates primarily to the production of titanium silicon carbide and composite compounds belonging to the same family.

2. Description of the Related Art

Oxygen-free combustion synthesis, also known as SHS (Self-propagating High Temperature Synthesis) is used generally in the production of intermetallic products and ceramic compositions.

In SHS technology, a mixture of two or more materials is ignited locally through the medium of an intensive heat source. This source may, for instance, consist of a heating coil or some other heating element, a laser beam, or an electron beam. The local ignition results in a local reaction, as a result of a powerful exothermic reaction. This causes the release of surplus energy, which ignites adjacent parts of the material and finally the whole of the material. This chain reaction is very rapid and, when the reaction is controlled, provides a highly effective way of mass-producing intermetals and ceramics. The highest temperature that can be reached by the system is the adiabatic temperature.

Many attempts to produce $Ti_3SiC_2$ have been made since the middle of the 1980's. Pampuch et al. (R. Pampuch et al., "Solid Combustion Synthesis of $Ti_3SiC_2$, J. EUR. CERAM. SOC., 5, 283–87 (1989)) and others have ignited a powder mixture of Ti, Si, and C in an inert atmosphere. This resulted in Ti3SiC2 + about 10–30% of other phases, such as TiC, $TiSi_2$ and SiC.

Goesmann et al. (F. Goesmann et al., "Preparation of $Ti_3SiC_2$ by ElectronBeam-Ignited Solid-State Reaction", J. Amer. Ceram. Soc., 81, 11, 3025–28 (1998)) believed that SHS would not result in a predominantly single phase consisting of $Ti_3SiC_2$ due to outgassing of metallic silicon as a result of the extremely high temperature of the reaction, above 2000° C. Goesmann commenced with a mixture of Ti and SiC with a chemical composition of $Ti_3SiC_2$+12.5 weight-% surplus silicon. He used an electron beam to ignite the mixture. The mixture was treated in three stages, namely heat treatment at 800° C., ignition at 900° C., followed by heat treatment at 1600° C. to achieve outgassing of surplus silicon. This method resulted in less than 8% of secondary phases in the sample.

In our own U.S. Patent Application No. 09/469,893 from December 1999, we have shown that atmospheric oxygen influences the thermal stability of $Ti_3SiC_2$ in the production process and also in the subsequent sintering process, by forming gaseous SiO, which is fundamentally different to vaporization of silicon due to high temperatures.

Thus, it has been found difficult to produce titanium silicon carbide in the aforesaid manner without obtaining other reaction products.

It has been mentioned above that the invention also relates to compositions in the same family. The family can be designated as being a single phase composition $M_3SiZ_2$, where M is at least one metal, and Z is at least one of the chemical elements C (carbon) and N (nitrogen).

The present invention relates to the problem of high costs in respect of the production of titanium silicon carbide.

SUMMARY OF THE INVENTION

The present invention thus relates to a method of producing a single-phase composition $M_{n+1}A_zX_n$, where n lies within a range of 0.8–3.2, where z lies within a range of 0.8–1.2, where M is at least one metal taken from the group of metals Ti (titanium), Sc (scandium), V (vanadium), Cr (chromium), Zr (zirconium), Nb (niobium) and Ta (tantalum), where X is at least one of the non-metals C (carbon) and N (nitrogen), and where A is at least one of the chemical elements Si (silicon), Al (aluminum) and Sn (tin) or a compound of said elements, such as to obtain the components $M_{n+1}A_zX_n$, of the final desired compound. The method also relates to forming a powder mixture from said metal, non-metal, and the last-mentioned chemical elements or a compound of said elements, and igniting said powder mixture within an inert atmosphere such as not to promote dissociation, wherewith said ingoing components react. The method further involves causing the reactant temperature to be kept at or above the temperature at which said components are caused to react, but beneath the temperature at which the single-phase composition dissociates.

DESCRIPTION OF THE PREFERRED EMBODIMENTS

The invention will now be described in more detail, partly with reference to three examples.

The method relates to the production of a single-phase (or one-phase) composition $M_{n+1}A_zX_n$, where n lies within a range of 0.8–3.2, where z lies within a range of 0.8–1.2, where M is at least one metal taken from the group of metals Ti (titanium), Sc (scandium), V (vanadium), Cr (chromium), Zr (zirconium), Nb (niobium) and Ta (tantalum), where X is at least one of the non-metals C (carbon) and N (nitrogen), and where A is at least one of the chemical elements Si (silicon), Al (aluminum) and Sn (tin) or a compound of said elements, such that the final, desired compound will include the components $M_{n+1}A_zX_n$. The method comprises forming a powder mixture of said metal, non-metal, and at least one of the last-mentioned chemical elements or a compound, and igniting the powder mixture such that it will react within an inert atmosphere. The inert atmosphere includes an atmosphere that has a sufficiently low partial pressure of oxygen to prevent promotion of dissociation.

According to the invention, the reaction temperature is caused to be kept at or above a level at which components are caused to react, but beneath the temperature at which the single-phase composition will dissociate.

Thus, an essential feature of the invention is to realize that the temperature is kept down during the reaction, but still above a given level nevertheless.

This is a preferred method of producing the single-phase composition $Ti_3SiC_2$.

According to a highly preferred embodiment, the temperature is kept down by adding pre-reacted $Ti_3SiC_2$, which material functions as a heat sink.

Up to about 25 weight-% of $Ti_3SiC_2$ is preferably used as a heat sink.

Alternatively, the temperature may be kept down during the reaction in other ways, for instance by controlled cooling of the material.

Below follow a number of examples.

EXAMPLE 1

Ti, SiC, and graphite powder were mixed together to produce a stoichiometric mixture for $Ti_3SiC_2$. This mixture was mixed with 12 weight-% pre-reacted $Ti_3SiC_2$.

The mixture was placed in a reaction vessel through which argon flowed at a rate of 0.5 l/min. The powder bed had a thickness of about 20 cm.

The bed was ignited by a molybdenum silicide element placed at the bottom of the reaction vessel. The bed components reacted The powder was removed from the vessel after cooling. The bed could be readily crushed. Samples taken from the bed were analyzed by means of x-ray diffraction. It was established that the bed contained about 24 weight-% TiC.

EXAMPLE 2

Same example as Example 1 but with the exception that 25 weight-% prereacted $Ti_3SiC_2$ was added to the mixture.

The bed was found to contain 15–20 weight-% TiC subsequent to ignition and cooling. Example 2 shows, among other things, that excessive dilution of pre-reactive material results in an incomplete reaction, wherewith the bed requires heat treatment at 1400° C. for eight hours in order to obtain a single-phase material.

EXAMPLE 3

Same example as Example 2 wherewith Ti, Si, and graphite powder were mixed together with 25 weight-% pre-reacted $Ti_3SiC_2$ and added to the mixture.

The bed was found to contain 25–30 weight-% TiC, after ignition and cooling.

Subsequent to heat treating the bed at 1400° C. for eight hours, the bed was found to contain less than 2 weight % TiC.

This example shows that Si can be used instead of SiC.

Although the invention has been described above with reference to a number of embodiments thereof, it will be understood that the temperature can be kept within the described range in ways other than described above, within the scope of the present invention.

The present invention shall therefore not be considered to be limited to the aforesaid exemplifying embodiments, since variations can be made within the scope of the accompanying claims.

What is claimed is:

1. A method of producing a single-phase composition $M_{n+1}A_zX_n$, by means of SHS (Self-propagating High Temperature Synthesis), where n lies within a range of 0.8–3.2, where z lies within a range of 0.8–1.2, where component M is at least one metal selected from the group consisting of Ti (titanium), Sc (scandium), V (vanadium), Cr (chromium), Zr (zirconium) , Nb (niobium) and Ta (tantalum), and where component X is at least one of the non-metals C (carbon) and N (nitrogen), and where component A is at least one of the chemical elements Si (silicon), Al (aluminum), and Sn (tin) or a compound containing at least one of said chemical elements, such that a final, desired compound will include the components $M_{n+1}A_zX_n$, said method comprising the steps of: forming a powder mixture from components M, X, and A; adding to the powder mixture a pre-reacted compound to provide a resulting mixture, the pre-reacted compound having the composition $M_{n+1}A_zX_n$ and serving as a heat sink; reacting the resulting mixture by igniting said powder mixture under an inert atmosphere to prevent dissociation of a resulting single-phase composition; and maintaining the reaction temperature at or above a temperature at which the components react but below a temperature at which the resulting single-phase composition dissociates.

2. A method according to claim 1, wherein n ranges from 1 to 3.

3. A method according to claim 1, wherein the single-phase material is $Ti_3SiC_2$.

4. A method according to claim 1, wherein the single-phase material is at least one of $Ti_2AlC$ and $Ti_2SnC$.

5. A method according to claim 1, wherein the pre-reacted material is present at about 25 weight- % of the mixed materials.

6. A method according to claim 5, wherein the pre-reacted material is $Ti_3SiC_2$.

7. A method according to claim 1, wherein the inert atmosphere has a partial pressure of oxygen sufficiently low to prevent dissociation of the single-phase composition.

* * * * *